(12) United States Patent
Kim

(10) Patent No.: US 8,225,032 B2
(45) Date of Patent: Jul. 17, 2012

(54) CIRCUIT AND METHOD FOR GENERATING DATA INPUT BUFFER CONTROL SIGNAL

(75) Inventor: Kwang-Hyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 429 days.

(21) Appl. No.: 12/490,412

(22) Filed: Jun. 24, 2009

(65) Prior Publication Data

US 2010/0049911 A1 Feb. 25, 2010

(30) Foreign Application Priority Data

Aug. 20, 2008 (KR) .................. 10-2008-0081292

(51) Int. Cl.
*G06F 13/00* (2006.01)
(52) U.S. Cl. ....................................................... 711/105
(58) Field of Classification Search .................... 711/105
See application file for complete search history.

(56) References Cited

U.S. PATENT DOCUMENTS

| 6,157,992 | A | 12/2000 | Sawada et al. | |
|---|---|---|---|---|
| 6,339,553 | B1 * | 1/2002 | Kuge | ............................. 365/194 |
| 6,868,021 | B2 | 3/2005 | Tanabe et al. | |
| 6,925,027 | B2 | 8/2005 | Eto et al. | |
| 2002/0008558 | A1 * | 1/2002 | Okuda et al. | .................. 327/175 |
| 2006/0203548 | A1 | 9/2006 | You | |
| 2008/0002498 | A1 * | 1/2008 | Cho | .............................. 365/208 |

FOREIGN PATENT DOCUMENTS

| JP | 2004-158081 | | 6/2004 |
|---|---|---|---|
| KR | 1020040090515 | A | 10/2004 |
| KR | 1020070019810 | A | 2/2007 |

OTHER PUBLICATIONS

Notice of Allowance issued from Korean Intellectual Property Office on Feb. 26, 2010.

* cited by examiner

*Primary Examiner* — Hoai V Ho
*Assistant Examiner* — Min Huang
(74) *Attorney, Agent, or Firm* — IP & T Group LLP

(57) ABSTRACT

A data input buffer control signal generating device is capable of preventing unnecessary operation and current consumption of blocks and thus stabilizing an internal operation of DRAM by generating a control signal which controls an enabling timing of a data input buffer not to be conflicted with an output data. The data input buffer control signal generating device includes a write-related control unit configured to generate a data input buffer reference signal generated on the basis of a write latency by a write command, a read-related control unit configured to replicate a delay through a data output path, delay an end command for a data output termination and generate a delayed end command, wherein the end command is generated by a read command, and an output unit configured to output a data input buffer control signal by combining the data input buffer reference signal and the output of the delayed end command.

19 Claims, 5 Drawing Sheets

CIRCUIT AND METHOD FOR GENERATING DATA INPUT BUFFER CONTROL SIGNAL

CROSS-REFERENCE TO RELATED APPLICATIONS

The present invention claims priority of Korean patent application number 10-2008-0081292, filed on Aug. 20, 2008, which is incorporated by reference in its entirety.

BACKGROUND OF THE INVENTION

The present invention relates to a dynamic random access memory (DRAM), and more particularly, to a technology capable of stabilizing the operation of the DRAM by controlling an enable time of a data input buffer thereof.

In a write operation of a DRAM employing a DDR3 system, a write command is inputted and data inputted through a data input/output (I/O) pin (DQ pin) is inputted into a data input buffer in synchronization with the write command. In this case, the data input buffer is not always in the turn-on state, but is controlled to be turned on/off in order to reduce current consumption.

Generally, the data input buffer is enabled at the time when write command is inputted. However, when the write operation is performed immediately after a read operation, the data input buffer may be turned on for the write operation at the time when data is outputted into the data I/O pin by a read command.

At this time, the data outputted into the data I/O pin may be entered into the data input buffer because the data input buffer is also connected to the data I/O pin. Thus, many blocks included in the data input buffer may be unnecessarily operated. The unnecessary operation of the blocks may cause an increase of the current consumption, and also a resultant noise component may increase the risk of affecting the read operation.

Hereafter, a typical circuit for generating a data input buffer enable signal will be described in detail with reference to FIGS. 1 and 2.

FIG. 1 is a diagram illustrating a typical circuit for generating a data input buffer control signal used in the DDR3 DRAM. The reference symbol "ECASPWT" means an external write command. Since the DDR3 DRAM supports an additive latency, referred to as "AL" hereafter, the circuit includes an AL shifter 10. The AL shifter 10 shifts the write command according to the AL. The AL shifter 10 generates a write command signal CASWT_AL by shifting the write command ECASPWT in response to an internal clock ICLK and a CAS latency CL<5:11>. When the AL=0, the timing of the generation of the write command signal CASWT_AL is identical to that of the input of the write command ECASPWT.

A write signal generating unit 12 receives the internal clock ICLK and a CAS write latency CWL <5:8> and generates write signals EWL_25 and EWL_15 having predetermined timings on the basis of a write latency WL using the write command signal CASWT_AL. In this case, the write signal EWL_25 is generated ahead by 2.5 clocks on the basis of the write latency WL, and the write signal EWL_15 is generated ahead by 1.5 clocks on the basis of the write latency WL.

The write signals EWL_25 and EWL_15 generated in the write signal generating unit 12 are provided to a write maintenance signal generating unit 14 and a control signal generating unit 16. The write maintenance signal generating unit 14 generates a write maintenance signal WTSTBY in synchronization with the internal clock ICLK, which is a signal maintained during a burst length beyond the write latency WL until the write operation is ended. The control signal generating unit 16 generates a data input buffer control signal ENDINDS using the write signals EWL_25 and EWL_15, the write maintenance signal WTSTBY, and a write enable control signal WTS_ALWL.

Here, the write enable control signal WTS_ALWL is generated by a write enable control unit 18 using an external WL pulse EWL_1P and the write command signal CASWT_AL. The external WL pulse EWL_1P is used to maintain the activation state of the write enable control signal WTS_ALWL during WL−1 clocks.

The data input buffer control signal ENDINDS described in FIG. 1 controls the input buffer of the I/O pin (DQ pin) and the I/O strobe pin (DQS pin). Because the DQ pin and DQS pin are commonly used for inputting and outputting data, the output driver and input buffer are commonly connected.

If only the read operation is performed, the input buffer keeps its closed state. Accordingly, there is no problem although data outputted through the pin flows into the input buffer. However, when the write operation is performed after the read operation, that is, the write command following the read command is inputted with a minimum gap as proposed in the spec, the input buffer is enabled while data is outputted, so that the output data may be transferred to the rear end of the input buffer. As a result, there may be blocks unnecessarily operated.

FIG. 2 is a timing diagram illustrating signals used for the circuit in FIG. 1.

The timing diagram of FIG. 2 is based on AL=0, CL=11, and CWL=8, assuming that the write command is inputted with a minimum gap following the read command.

As illustrated in FIG. 2, by the read command, data is outputted through the DQ pin at a time when CL=11. Also, when the write command is inputted, the write enable control signal WTS_ALWL is changed to a logic high level, and maintained until the timing of the WL−1 clocks.

The write signal EWL_25 changes its logic level at the timing of WL−2.5 clocks, and the write signal EWL_15 changes its logic level at the timing of WL−1.5 clocks. Also, in order to maintain a stand-by state until the write operation is completely ended, the write maintenance signal WTSTBY maintains its logic high level from WL−1.5 clocks to WL+3.5 clocks. Finally, by performing a logic OR operation on the four signals, the data input buffer control signal ENDINDS is generated.

According to the operation as described above, while data are outputted through the DQ pin, the data input buffer control signal ENDINDS changes its logic level, so that the input buffer keeps its open state.

Accordingly, in the typical circuit for generating a data input buffer control signal, an operation error may occur due to a conflict of the read data and the write data, and also an excessive current consumption may occur due to unnecessary operation of blocks.

SUMMARY OF THE INVENTION

Embodiments of the present invention are directed to providing a data input buffer control signal generating device capable of preventing unnecessary operation and current consumption of blocks and thus stabilizing an internal operation of DRAM by generating a control signal which controls an enabling timing of a data input buffer not to be conflicted with an output data.

In accordance with an aspect of the present invention, there is provided a data input buffer control signal generating device, which includes a write-related control unit configured to generate a data input buffer reference signal generated on the basis of a write latency by a write command, a read-related control unit configured to replicate a delay through a data output path, delay an end command for a data output termination and generate a delayed end command, wherein the end command is generated by a read command, and an output unit configured to output a data input buffer control signal by combining the data input buffer reference signal and the delayed end command.

In accordance with another aspect of the present invention, there is provided a data input buffer control signal generating device, which includes a write signal generating unit configured to generate a plurality of write signals with different timings in advance of a write latency of 0 in response of a write command, a write maintenance signal generating unit configured to generate a write maintenance signal maintained at an enable state during a burst length until a write operation is ended in response to the write signals, a control signal generating unit configured to generate a data input buffer reference signal in response to the plurality of write signals and the write maintenance signal, a replica delay unit configured to replicate a delay through a data output path, delay an end command and generate a delayed end command, wherein the end command is provided to terminate a data output operation, and an output unit configured to output a data input buffer control signal by combining the data input buffer reference signal and the delayed end command, the data input buffer control signal being activated by the delayed end command, and deactivated by the data input buffer reference signal.

The additive latency shifter is may be further included. The additive latency shifter configured to shift the external write command based on an additive latency, and output the shifted write command to the write signal generating unit.

In accordance with further aspect of the present invention, there is provided a method of generating a data input buffer control signal, the method including generating a data input buffer reference signal activated simultaneously with or prior to a write latency of 0 after a write command, replicating a delay through a data output path, delaying an end command for a data output termination and generating a delayed end command, wherein the end command is generated by a read command, and generating a data input buffer control signal by combining the data input buffer reference signal and the delayed end command, the data input buffer control signal being activated by the delayed end command, and deactivated by the data input buffer reference signal.

DESCRIPTION OF SPECIFIC EMBODIMENTS

Other objects and advantages of the present invention can be understood by the following description, and become apparent with reference to the embodiments of the present invention.

Embodiments of the present invention discloses a technology of controlling an enabling of a data input buffer by combining a read-related control signal with a write-related control signal so that a data input buffer may not be operated when a read operation is performed, to remove instability and current consumption factors caused by a prior art method of controlling an enabling timing of the data input buffer using only a write command.

Figure 3:
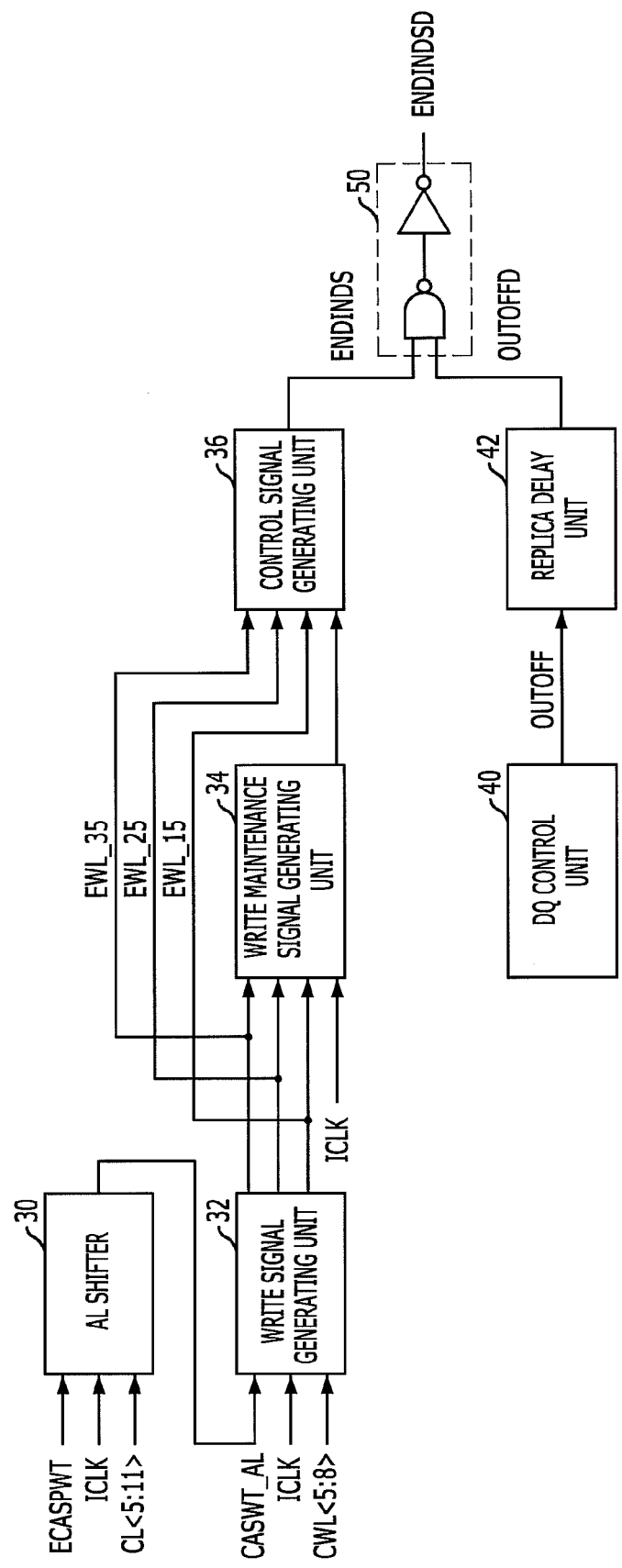
FIG. 3 is a block diagram illustrating a circuit for generating a data input buffer control signal in accordance with an embodiment of the present invention.

FIG. 3 is a block diagram illustrating a circuit for generating a data input buffer control signal in accordance with an embodiment of the present invention. Referring to FIG. 3, the circuit for generating a data input buffer control signal includes an additive latency (AL) shifter 30, a write signal generating unit 32, a write maintenance signal generating unit 34, a control signal generating unit 36, a DQ control unit 40, a replica delay unit 42, and an output unit 50.

In the above configuration, the AL shifter 30, the write signal generating unit 32, the write maintenance signal generating unit 34, and the control signal generating unit 36 are included in a write-related control unit. The write-related control unit generates and outputs a data input buffer reference signal ENDINDS that is generated by a write command and activated simultaneously with or prior to the timing based on the write latency (WL) of 0 after the write command.

The DQ control unit 40 and replica delay unit 42 are included in a read-related control unit. The read-related control unit replicates a delay of a data output path, delays, by the same delay amount, an end command, which is generated by a read command in order to terminate a data output operation, and outputs the delayed signal.

The output unit 50 outputs a data input buffer control signal ENDINDSD by combining the data input buffer reference signal ENDINDS of the write-related control unit and the output OUTOFFD of the read-related control unit. The data input buffer control signal ENDINDSD is activated by the output OUTOFFD of the read-related control unit, and deactivated by the data input buffer reference signal ENDINDS.

Hereafter, the configuration and operation of the circuit for generating the data input buffer control signal in accordance with an embodiment of the present invention will be more fully described with reference to FIGS. 3 and 4.

Referring to FIG. 3, an external write command ECASPWT, an internal clock ICLK, and a CAS latency CL<5:11> are inputted into the AL shifter 30. In order to implement a function of an additive latency AL supported in a DDR3 DRAM, a write command is shifted according to the additive latency AL. The AL shifter 30 outputs a shifted write command signal CASWT_AL. When the AL=0, the shifted write command signal CASWT_AL is outputted at the same time when the write command is inputted.

The write signal generating unit 32 receives the internal clock ICLK and a CAS write latency CWL <5:8> to generate write signals EWL_35, EWL_25 and EWL_15 having predetermined timings on the basis of the write latency WL using the shifted write command signal CASWT_AL. In this case, the write signal EWL_35 is generated ahead by 3.5 clocks on the basis of the write latency WL, the write signal EWL_25 is generated ahead by 2.5 clocks on the basis of the write latency WL, and the write signal EWL_15 is generated ahead by 1.5 clocks on the basis of the write latency WL.

The write signals EWL_35, EWL_25 and EWL_15 generated in the write signal generating unit 32 are provided to the write maintenance signal generating unit 34 and the control signal generating unit 36. The write maintenance signal generating unit 34 generates a write maintenance signal WTSTBY in synchronization with the internal clock ICLK, which is a signal maintained during a burst length beyond the write latency WL until the write operation is ended. The control signal generating unit 36 generates the data input buffer reference signal ENDINDS using the write signals EWL_35, EWL_25 and EWL_15, and the write maintenance signal WTSTBY.

The DQ control unit 40 outputs an end signal OUTOFF by a read command (not shown). The end signal OUTOFF is a signal for controlling an output driver to operate during the read operation. Since the end signal OUTOFF outputted from the DQ control unit 40 is transmitted in synchronization with a DLL clock, a timing difference which corresponds to a delay time between the end signal OUTOFF and the external clock due to a data output path occurs. Accordingly, the end signal OUTOFF is delayed at the replica delay unit 42 modeling the data output path, and is then outputted as a signal OUTOFFD.

The output unit 50 receives the signal outputted from the control signal generating unit 36 and the signal outputted from the replica delay unit 42 to thereby output a signal ENDINDSD. The output 50 may include a NAND gate configured to perform a NAND operation on the inputted signals, and an inverter configured to invert an output signal of the NAND gate.

The data input buffer control signal ENDINDSD outputted from the output unit 50 is activated by the output of the replica delay unit 42, and deactivated by the data input buffer reference signal ENDINDS of the control signal generating unit 36.

Figure 4:
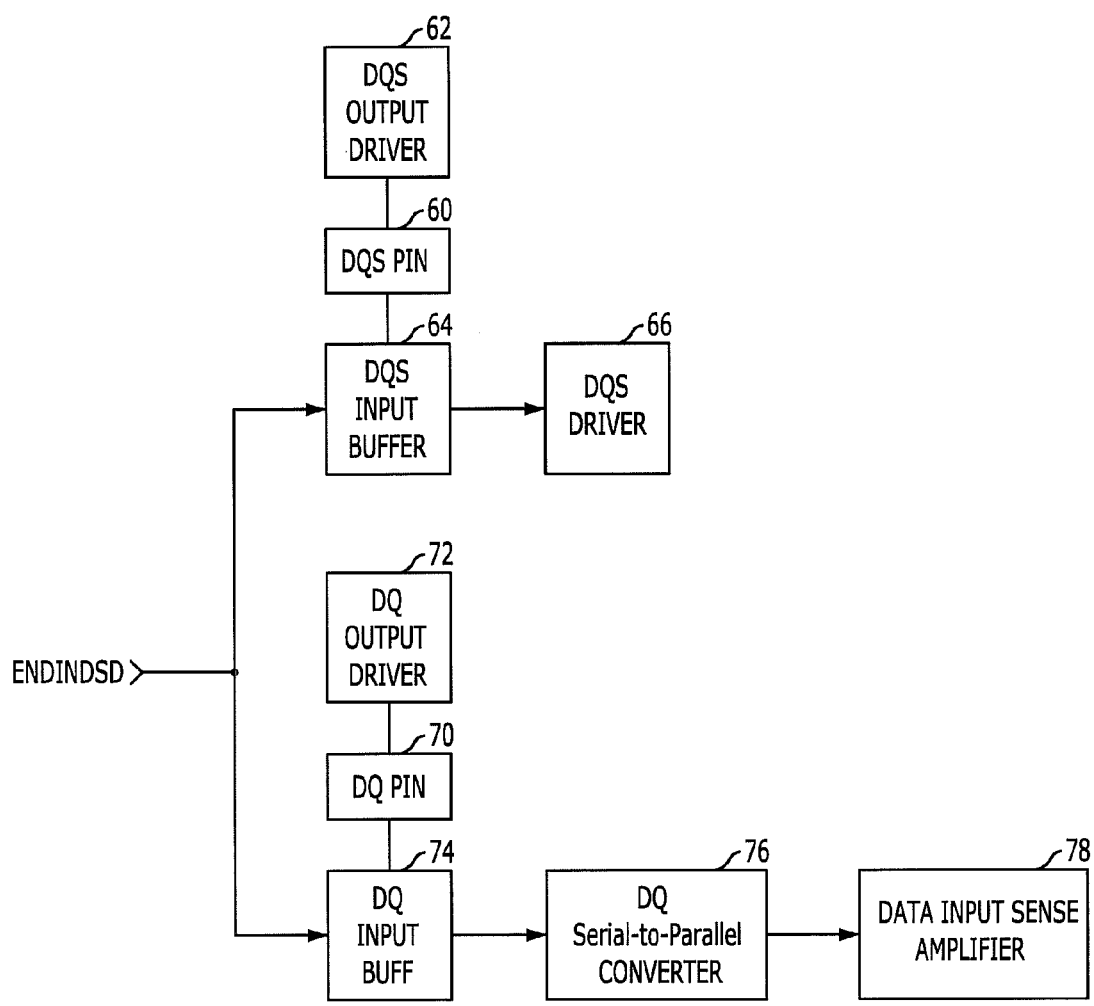
FIG. 4 is a block diagram illustrating a DQ part operating in response to the data input buffer control signal described in FIG. 3.

The data input buffer control signal ENDINDSD in FIG. 3 is provided to a DQ part illustrated in FIG. 4.

The DQ part includes a DQS pin 60 and a DQ pin 70. The DQS pin 60 and DQ pin 70 are commonly used for inputting and outputting data. Accordingly, output drivers 62 and 72 and input buffers 64 and 74 are commonly connected to the DQS pin 60 and DQ 70. A DQS driver 66 is connected to the DQS input buffer 64 to drive a data strobe signal DQS. A DQ serial-to-parallel converter 76 is connected to the DQ input buffer 64 to convert serial-data into parallel-data in response to the data strobe signal DQS provided from the DQS driver 66. For example, since an 8-bit pre-fetch is performed in DDR3 DRAM, data is arranged by 8-bit. The arranged data is amplified by a data input sense amplifier 78.

The data input buffer control signal ENDINDSD is inputted into the input buffers 64 and 74. The input buffers 64 and 74 are controlled so as not to operate during the read operation. After the read operation is ended, the input buffers 64 and 74 are activated for the write operation. Accordingly, the data input buffer control signal ENDINDSD can control the unnecessary operations of the input buffers 64 and 74, the DQS driver 66, and the serial-to-parallel converter 76, related to the data input.

Especially, in the DDR3 DRAM performing the 8-bit pre-fetch, since many D-flipflop circuits are provided in the serial-to-parallel converter 76, amount of current consumption can be reduced due to prevention of the unnecessary operations in accordance with the embodiment of the present invention. Also, it will be understood that much more current consumption can be reduced in consideration of the total number of DQ pins over a chip, and a noise occurrence can be restrained.

Moreover, since the buffers 64 and 74 are prevented from operating in the read operation, a conflict phenomenon between the write data and the read data can be prevented.

Figure 5:
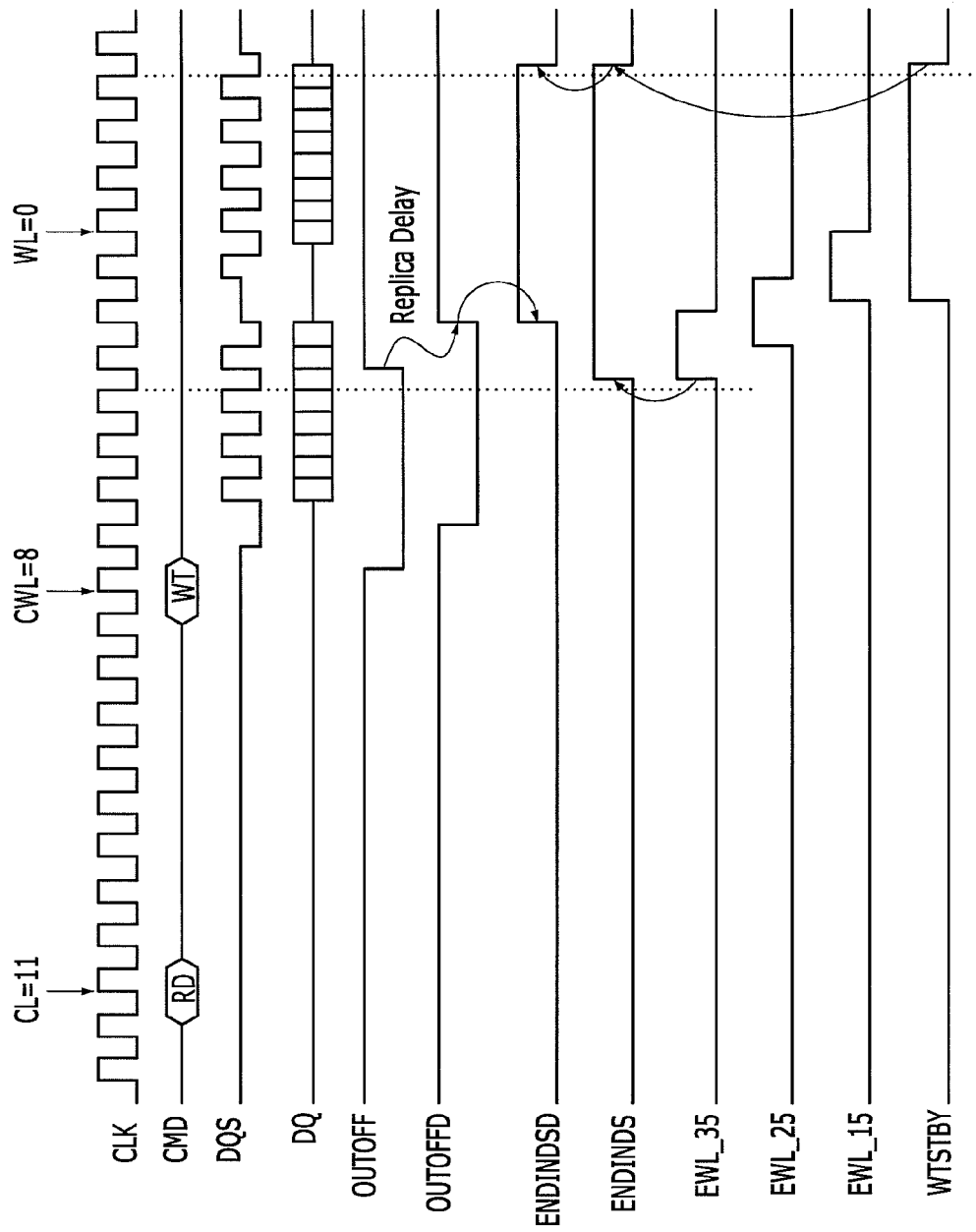
FIG. 5 is a timing diagram of signals for the circuit described in FIG. 3.

FIG. 5 is a timing diagram of signals used for the circuit described in FIG. 3.

The timing diagram of FIG. 5 is based on AL=0, CL=11, and CWL=8. It is considered that the write command WT is inputted with a minimum gap in the spec following the read command RD.

Figure 1:
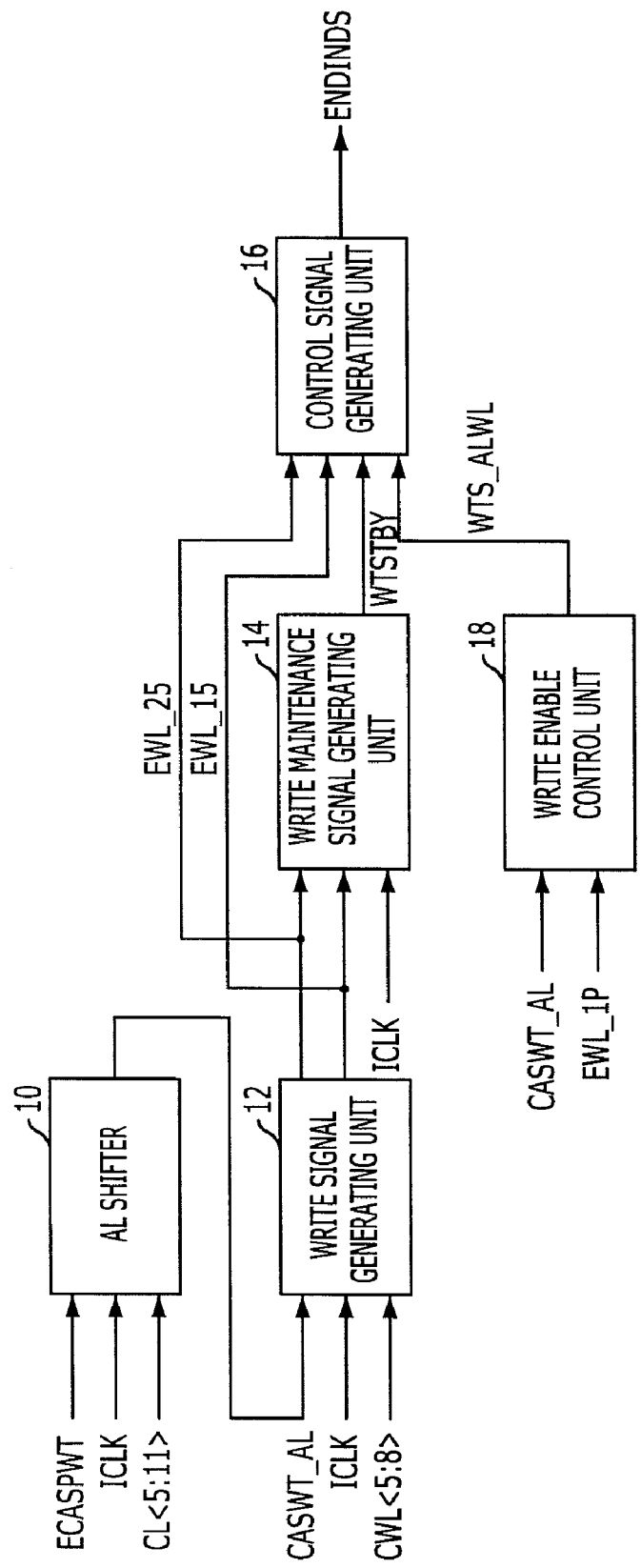
FIG. 1 is a block diagram illustrating a typical circuit for generating a data input buffer control signal.
Figure 2:
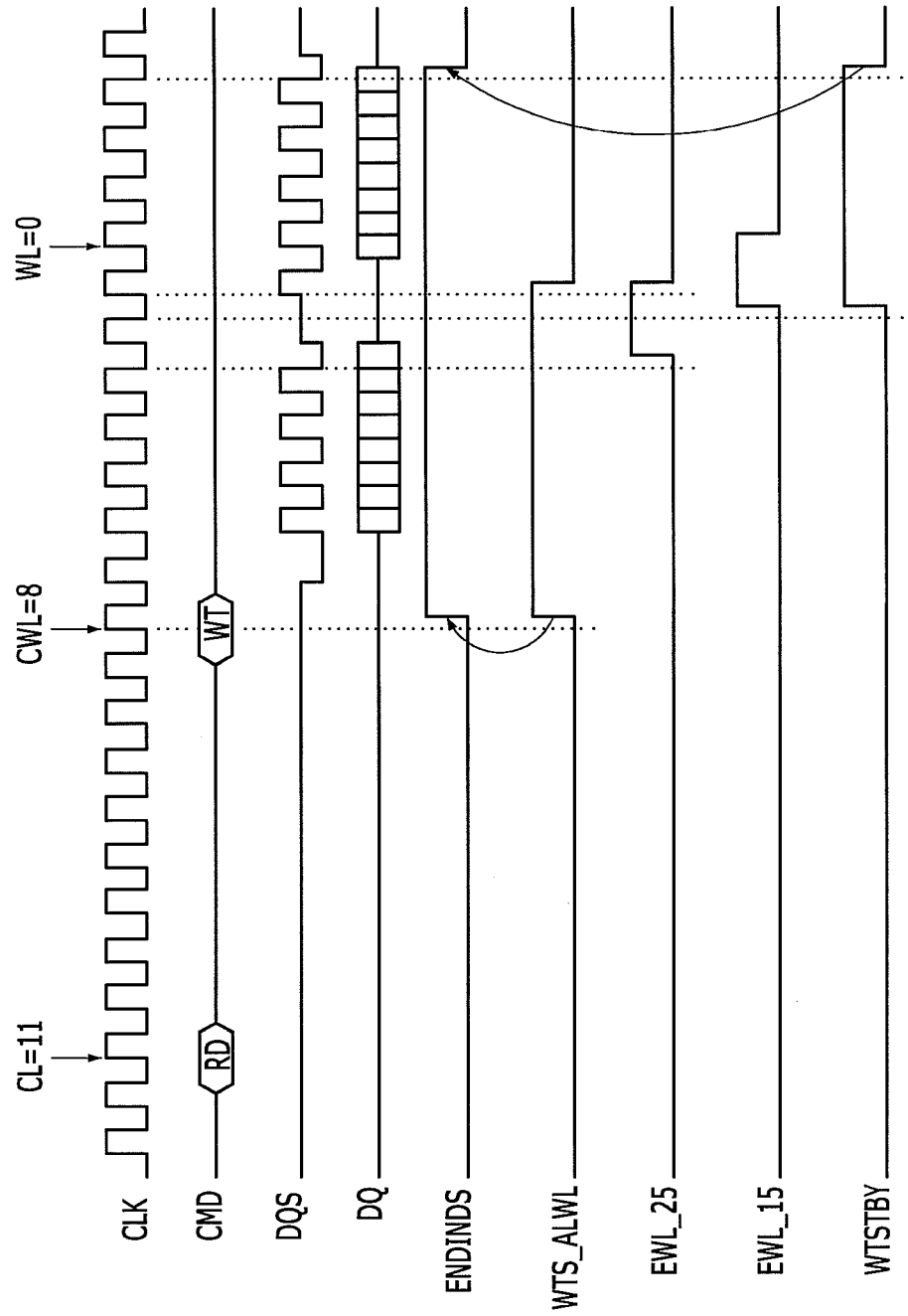
FIG. 2 a timing diagram of signals used for the circuit in FIG. 1.

In FIG. 5, since the data input buffer reference signal ENDINDS is generated by the write signal EWL_35, the start timing is delayed compared to that of FIG. 2, and the end timing is synchronized with the write maintenance signal WTSTBY.

Thus, the data input buffer control signal ENDINDSD is activated at the timing when the signal OUTOFFD obtained by delaying the end signal OUTOFF goes to a logic high level, and deactivated at the timing when the data input buffer reference signal ENDINDS goes to a logic low level.

As described above, since the data input buffer control signal ENDINDSD is generated in accordance with the inventive circuit and method, the current consumption and noise occurrence can be reduced.

In accordance with the embodiments of the present invention, by controlling an input buffer with write and read information, it is possible to prevent data from being entered into the input buffer when a write operation is performed following a read operation. Also, the current consumption of blocks can be reduced by controlling unnecessary operation of blocks, and the entrance of noises into an output terminal can be avoided. Therefore, the stability of a chip can be secured.

While the present invention has been described with respect to the specific embodiments, it will be apparent to those skilled in the art that various changes and modifications may be made without departing from the spirit and scope of the invention as defined in the following claims.

What is claimed is:

1. A data input buffer control signal generating device, comprising:
    a write-related control unit configured to generate a data input buffer reference signal generated on the basis of a write latency by a write command;
    a read-related control unit configured to replicate a delay through a data output path, delay an end command for a data output termination, and generate the delayed end command, wherein the end command is generated by a read command; and
    an output unit configured to output a data input buffer control signal by combining the data input buffer reference signal and the delayed end command.

2. The data input buffer control signal generating device of claim 1, wherein the data input buffer reference signal is activated simultaneously with or prior to the write latency of 0 after the write command.

3. The data input buffer control signal generating device of claim 1, wherein the data input buffer control signal is activated by the delayed end command and deactivated by the data input buffer reference signal.

4. The data input buffer control signal generating device of claim 2, wherein the write-related control unit includes:
    an additive latency shifter configured to shift the write command based on an additive latency to output a shifted write command;
    a write signal generator configured to generate a plurality of write signals, each having a predetermined timing in advance of the write latency of 0, in response to the shifted write command;
    a write maintenance signal generator configured to generate a write maintenance signal maintained at an enable state during a burst length until a write operation is ended in response to the write signals; and a control signal generator configured to generate the data input buffer reference signal using the plurality of write signals and the write maintenance signal.

5. The data input buffer control signal generating device of claim 4, wherein the additive latency shifter is configured to receive the write command and a CAS latency information that are inputted from the outside, and shift the write command by the additive latency in synchronization with an internal clock.

6. The data input buffer control signal generating device of claim 4, wherein the write signal generator is configured to receive the shifted write command and a write latency information to generate the write signals having timings of at least 1.5 clock, 2.5 clock, or 3.5 clock in advance of a timing corresponding to a write latency of 0, respectively.

7. The data input buffer control signal generating device of claim 6, wherein the write signal is generated when the additive latency is 0, the CAS latency is 11, and the write latency is 8.

8. The data input buffer control signal generating device of claim 1, wherein the read-related control unit includes:
    an input/output (I/O) pin controller configured to generate the end command generated by the read command to terminate the data output operation; and
    a replica delay configured to delay the end command by an amount of delay corresponding to the data output path.

9. The data input buffer control signal generating device of claim 1, wherein the output unit includes at least an NAND gate performing a NAND operation on the data input buffer reference signal and the delayed end command.

10. A data input buffer control signal generating device, comprising:
    a write signal generating unit configured to generate a plurality of write signals with different timings in advance of a write latency of 0 in response to a write command;
    a write maintenance signal generating unit configured to generate a write maintenance signal maintained at an enable state during a burst length until a write operation is ended in response to the write signals;
    a control signal generating unit configured to generate a data input buffer reference signal in response to the plurality of write signals and the write maintenance signal;
    a replica delay unit configured to replicate a delay through a data output path, delay an end command and generate a delayed end command, wherein the end command is provided to terminate a data output operation; and
    an output unit configured to output a data input buffer control signal by combining the data input buffer reference signal and the delayed end command, the data input buffer control signal being activated by the delayed end command, and deactivated by the data input buffer reference signal.

11. The data input buffer control signal generating device of claim 10, further comprising:

an additive latency shifter configured to shift an external write command based on an additive latency, and output a shifted write command to the write signal generating unit as the write command.

12. The data input buffer control signal generating device of claim 11, wherein the additive latency shifter is configured to receive the external write command and a CAS latency information that is inputted from the outside, and shift the external write command by an additive latency in synchronization with an internal clock.

13. The data input buffer control signal generating device of claim 10, wherein the write signal generating unit is configured to receive the write command and a write latency information to generate the write signals having timings of at least 1.5 clock, 2.5 clock, or 3.5 clock in advance of a timing corresponding to the write latency of 0, respectively.

14. The data input buffer control signal generating device of claim 13, wherein the write signal is generated when the additive latency is 0, the CAS latency is 11, and the write latency is 8.

15. The data input buffer control signal generating device of claim 10, wherein the output unit includes at least an NAND gate performing a NAND operation on the data input buffer reference signal and the delayed end command.

16. A method of generating a data input buffer control signal, the method comprising:
    generating a data input buffer reference signal activated simultaneously with or prior to a write latency of 0 after a write command;
    replicating a delay through a data output path, delaying an end command for a data output termination and generating a delayed end command, wherein the end command is generated by a read command; and
    generating a data input buffer control signal by combining the data input buffer reference signal and the delayed end command, the data input buffer control signal being activated by the delayed end command, and deactivated by the data input buffer reference signal.

17. The method of claim 16, wherein generating the data input buffer reference signal includes:
    shifting an external write command based on an additive latency to output a shifted write command;
    generating a plurality of write signals, each having a different timing in advance of the write latency of 0, in response to the shifted write command;
    generating a write maintenance signal maintained at an enable state during a burst length until a write operation is ended in response to the plurality of write signals; and
    generating the data input buffer reference signal using the plurality of write signals and the write maintenance signal.

18. The method of claim 17, wherein the external write command is shifted by the additive latency using a CAS latency in synchronization with an internal clock.

19. The method of claim 17, wherein each of the write signals is generated ahead by 1.5 clocks, 2.5 clocks, or 3.5 clocks based on the write latency of 0.

* * * * *